United States Patent [19]
Beatson et al.

[11] Patent Number: 6,114,902
[45] Date of Patent: Sep. 5, 2000

[54] FREQUENCY TRACKING ARRANGEMENTS

[75] Inventors: Trevor P Beatson, Manchester; Nicholas Mihailovits, Sale; Brendan P Fenney, Prestwich; David I Boddy, Rawtenstall, all of United Kingdom

[73] Assignee: Mitel Semiconductor Limited, Wiltshire, United Kingdom

[21] Appl. No.: 09/035,395

[22] Filed: Mar. 5, 1998

[30] Foreign Application Priority Data

Mar. 7, 1997 [GB] United Kingdom .................... 9704719

[51] Int. Cl.$^7$ ........................................................ H03K 5/00
[52] U.S. Cl. ........................... 327/553; 327/557; 330/305
[58] Field of Search .................................. 327/552, 553, 327/558, 557; 330/107, 109, 305

[56] References Cited

U.S. PATENT DOCUMENTS

| | | | |
|---|---|---|---|
| 4,309,649 | 1/1982 | Naito | 323/212 |
| 4,782,246 | 11/1988 | Kuroyanagi et al. | 327/262 |
| 4,873,491 | 10/1989 | Wilkins | 327/280 |
| 4,958,120 | 9/1990 | Gopinathan et al. | 327/244 |
| 5,105,108 | 4/1992 | Ngo | 327/158 |
| 5,200,716 | 4/1993 | Amano | 327/553 |

FOREIGN PATENT DOCUMENTS

| | | |
|---|---|---|
| 0 103 404 A2 | 3/1984 | European Pat. Off. . |
| 0 487 902 A2 | 6/1992 | European Pat. Off. . |
| 40409021A | 3/1992 | Japan .................................. 327/553 |
| 1 300 392 | 12/1972 | United Kingdom . |
| 2 110 893 | 6/1983 | United Kingdom . |
| 2 130 825 | 6/1984 | United Kingdom . |
| 2 190 255 | 11/1987 | United Kingdom . |
| 2 194 402 | 3/1988 | United Kingdom . |
| 2 197 553 | 5/1988 | United Kingdom . |
| WO 85/00478 | 1/1985 | WIPO . |
| WO 94/26032 | 11/1994 | WIPO . |

OTHER PUBLICATIONS

INSPEC Abstract of Journal Article: A 27 MHz Programmable Bipolar 0.05 Degrees Equiripple Linear–Phrase Lowpass Filter, by Veirman, et al., 1992 IEEE International Solid State Circuits Conference. Digest of Technical Papers. 39th ISSCC (Cat. No. 92CH3128–6) P. 64–5, 244, IEEE, 1992, New York, USA.

INSPEC Abstract of Journal Article: A 4–MHz CMOS Continuous–Time filter With On–Chip Automatic Tuning, by Krummenacher, et al., IEEE Journal of Solid State Circuits, vol. 23, No 3, p. 750–8, Jun. 1988, USA.

INSPEC Abstract of Journal Article: An Integrated Continuous–Time Filters For Video Frequencies, by Johl, et al., in Journal Mitteilungen Agen No. 45, p. 31–8, Jun 1987, Switzerland.

*Primary Examiner*—Dinh T. Le
*Attorney, Agent, or Firm*—Townsend and Townsend and Crew LLP

[57] ABSTRACT

A frequency tracking arrangement in which a frequency tracking circuit utilizes a continuously variable analogue first order all-pass filter circuit as a controllable phase-shift element in a closed-loop system which produces a control signal to control the phase shift circuit to introduce a 90° phase shift of a received reference frequency signal when the circuit is tracking that reference frequency. The control signal may then be utilized to slave the cut-off frequency of a filter and/or the delay time introduced by a delay line.

9 Claims, 3 Drawing Sheets

FREQUENCY TRACKING ARRANGEMENTS

BACKGROUND OF THE INVENTION

The present invention relates to frequency tracking arrangements. In particular although not exclusively the invention is concerned with frequency tracking arrangements by means of which the cut-off frequency of a continuous-time filter and/or the delay of one or more delay lines may be controlled in dependence upon the frequency of a reference frequency input signal.

Such an arrangement may be used, for example, in the retrieval of data from an optical disk data carrier, where data is stored as a predetermined number of bits per unit length of data storage path. When reading such data carriers, the disk must rotate faster when data is being read from near the center of the disk, or the data rate is slower, than when data is being read from near the periphery of the disk. A continuous frequency tracking/filter cut-off arrangement would allow data to be read at the different rates or while the disk is being speeded up or slowed down.

Automatic adjustment of a filter characteristic is known, for example, from prior patent specification GB 2194402, in which the time constant of a filter circuit is controlled by a frequency tracking loop utilizing a voltage-controlled oscillator. The control of the delay introduced by a delay line is described in GB 2130845, where the phase shift corresponding to that delay is compared with a fixed 90° phase shift of an input signal in a closed loop system.

SUMMARY OF THE INVENTION

According to one aspect of the present invention, a frequency tracking arrangement comprises a continuously variable analogue phase shift circuit, a phase comparator, means to apply a reference frequency signal to respective inputs of the phase comparator directly and by way of said phase shift circuit, and means to derive a control signal for controlling the value of phase shift provided by said phase shift circuit in dependence upon the output of said comparator.

The control signal may be utilized to control the cut-off frequency of a controllable continuous-time or analogue filter, or to control the value of delay introduced by a controllable delay line.

The phase shift circuit may take the form of a first order all-pass filter, and this all-pass filter and the controllable analogue filter may utilize active filter circuits of the kind described in Applicants' co-pending application No. GB 9622182.5.

According to another aspect of the present invention a frequency tracking arrangement comprises a frequency tracking circuit for providing a control signal the value of which is dependent upon the frequency of a reference frequency signal applied thereto, and a controllable analogue filter arrangement to which said control signal is arranged to be applied to control the cut-off frequency thereof.

According to another aspect of the present invention a frequency tracking arrangement comprises a frequency tracking circuit for providing a control signal the value of which is dependent upon the frequency of a reference frequency signal applied thereto, and one or more controllable delay lines to which said control voltage is arranged to be applied to control the respective values of delay thereof.

BRIEF DESCRIPTION OF THE DRAWINGS

A frequency tracking arrangement in accordance with the invention will now be described with reference to the accompanying drawings, of which.

DETAILED DESCRIPTION OF THE PREFERRED EMBODIMENTS

Figure 1:
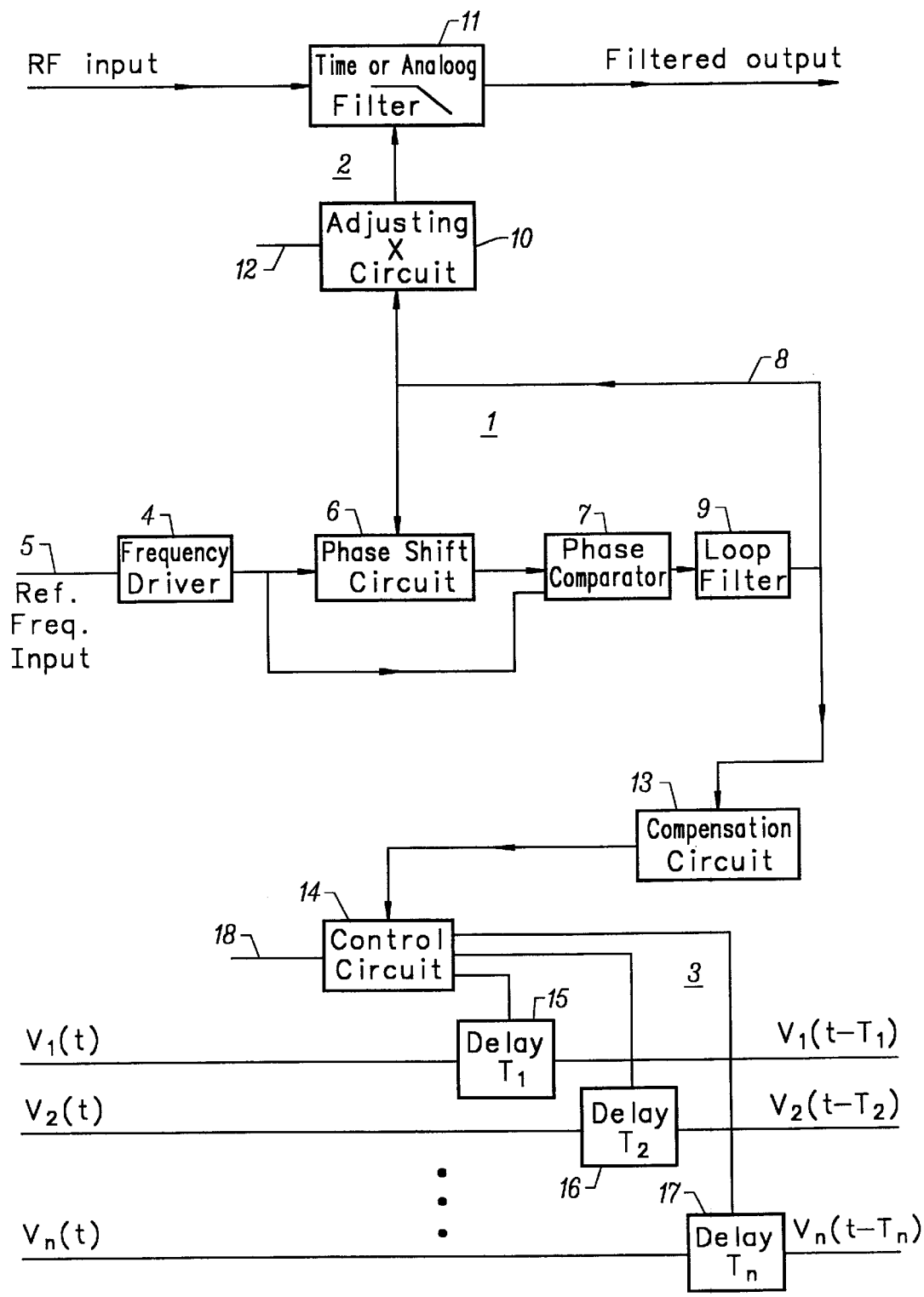
FIG. 1 shows the arrangement schematically.

Referring first to FIG. 1, the frequency tracking arrangement comprises a frequency tracking circuit 1, a controllable cut-off frequency filter 2 and a controllable delay arrangement 3.

The frequency tracking circuit 1 comprises a frequency divider 4 which receives a reference frequency input signal on a path 5 and which provides a frequency-divided signal to a controllable phase shift circuit 6 and to a phase comparator 7, which also receives a phase-shifted signal from the phase shift circuit 6. The phase comparator 7 provides a d.c. or slowly varying control signal on a path 8 by way of a loop filter 9, which may be a low-pass filter. The control signal is returned to a control input of the phase shift circuit to control the value of phase shift introduced by that circuit.

The control signal on the path 8 is also applied by way of an adjusting circuit 10 to a controllable continuous time or analogue filter 11, the adjusting circuit 10 being arranged to provide any required off-sets or factoring in dependence upon an adjusting signal on a path 12, and by way of a compensation circuit 13 and a control circuit 14 to control the values of delay introduced by delay lines 15 to 17. Again the circuits 13 and 14 provide any necessary off-sets and factoring in dependence upon a control signal on a path 18.

The cut-off frequency $F_c$ of the filter 11 and the delay $T_{del}$ introduced by any one of the delay lines 15 to 17 may be arranged to lock to and track the incoming reference frequency signal $F_{ref}$ such that:

$$F_c = K1.(F_{ref})$$

and $$T_{del} = K2.1/(F_{ref})$$

The frequency divider 4 ensures a 50% duty cycle for signal to the phase shift circuit 6 and the phase comparator 7, the divide ratio allowing a degree of coarse control over the cut-off frequency of the filter 11 and the delays introduced by the delay lines 15 to 17.

The phase shift circuit 6, the phase comparator 7 and the loop filter 9 form a closed loop control system which adjusts the phase shift such that the control signal on the path 8 is virtually zero. The choice of phase shift circuit 6 and phase comparator 7 are important. In particular:

i) the phase shift circuit should have a phase/frequency characteristic which offers substantially zero phase shift a low frequencies and substantially 180° phase shift at very high frequencies, and ii) the phase comparator/loop filter combination should provide substantially zero net output when the divided reference frequency signal and the phase-shifted signal are in phase quadrature.

The latter condition ensures that the closed control loop will lock when the phase shift circuit is introducing (90°+ n.180°) of phase shift. If the maximum phase shift which can be introduced is 180°, solutions for n>o, and "harmonic locking", are effectively impossible, and the loop has an extremely wide capture range. The preferred choice for the phase shift circuit is an active filter having a first order all-pass characteristic, such as the circuit illustrated in FIG.

2, since this circuit has the necessary phase/frequency response while providing a flat amplitude response.

Alternatively a second order low-pass filter can be used, although the attendant amplitude response can present problems when the frequency tracking circuit 1 is required to track a step increase in reference frequency. It is also possible to use a delay line, but since this can introduce phase shifts of greater than 180° the advantage of wide capture range may be lost.

By constructing the phase shift circuit 6 from similar circuits to those of the filter 11, the filter 11 will be adjusted approriately each time the tracking circuit responds to a change in reference frequency signal. Furthermore, the effects of physical and process variations, which would otherwise cause a shift in the characteristics of the filter 11, are compensated for because they affect the phase shift circuit 6 and the filter 11 in an identical manner. Further control over the relationship between the reference frequency and the characteristics of the filter 11 are made possible by means of the adjusting circuit 10, which may for example introduce an offset voltage or a factor to the control voltage as applied to the filter 11.

Since the delay lines 15 to 17 may not be constructed from similar circuit elements to those used in the phase shift circuit 6 and the filter 11, the compensation circuit 13 may be used to remove the dependence on physical or process variables which are not common to the delay line elements. The control circuit 14 may be used to adjust the absolute value of each delay with respect to the reference frequency and also the relative delay between delay lines as required in any particular system.

Figure 2:
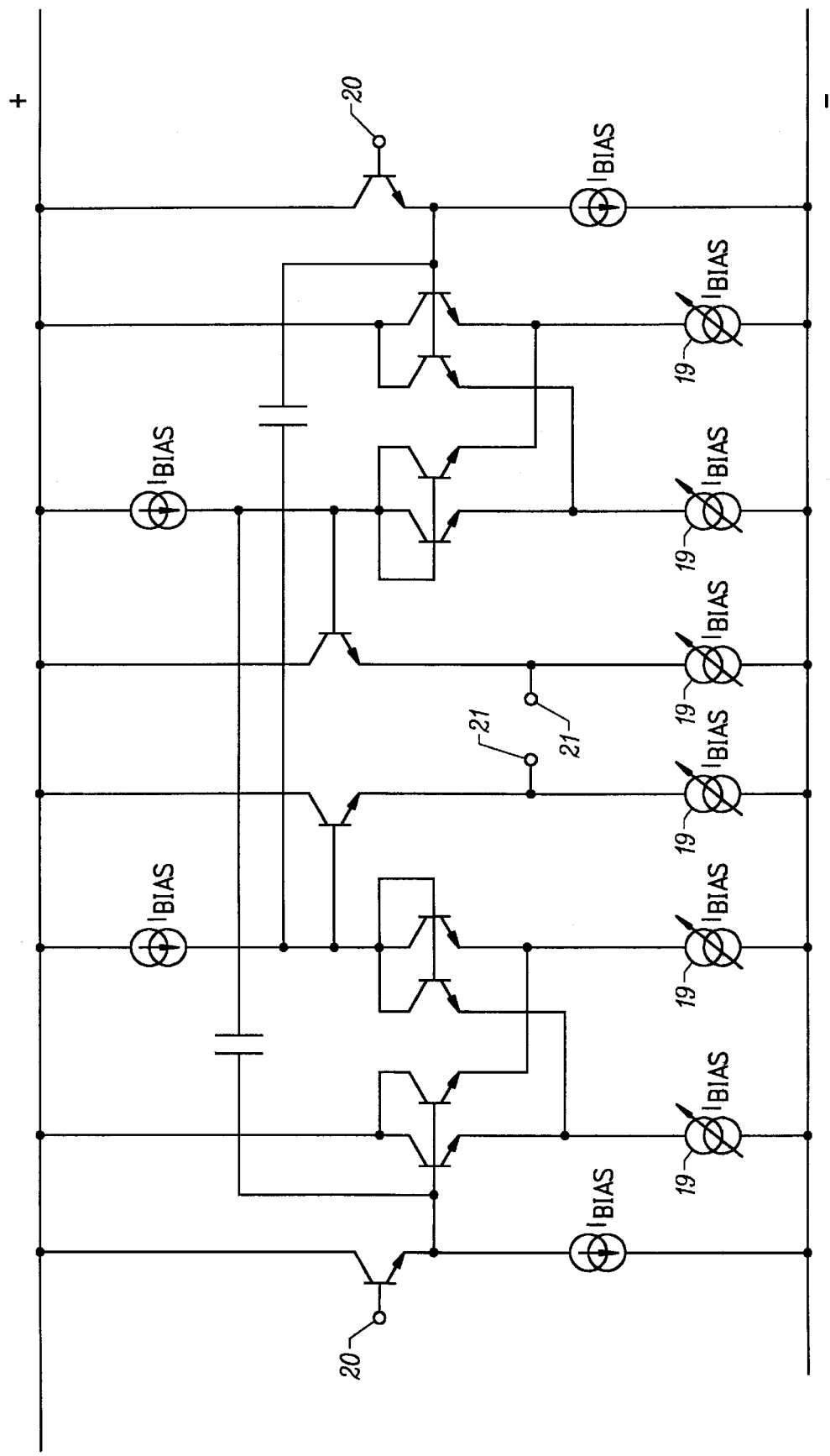
FIGS. 2 and 3 show diagrammatically respective parts of the arrangement shown in FIG. 1.

Referring now to FIG. 2, the phase shift circuit 6 may comprise an active filter network as described in co-pending Patent Application No. GB 9622182.5, the control voltage on the path 8 being applied to control the variable current sources 19 such that an input signal frequency applied to input terminals 20 appears phase-shifted at output terminals 21.

Figure 3:
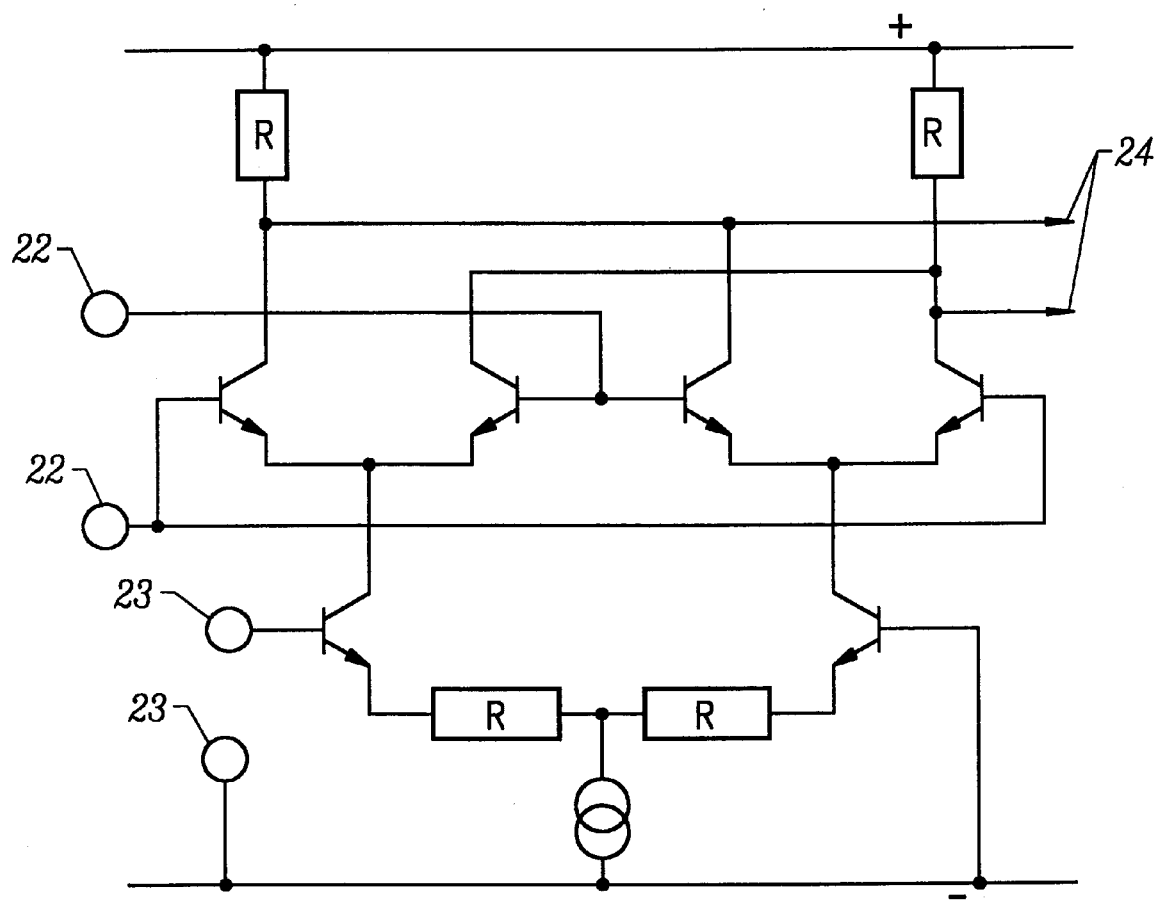

Referring to FIG. 3, the phase comparator 7 may comprise an exclusive OR gate, or an analogue multiplier circuit such as the Gilbert cell shown, signals from the phase shift circuit 6 and from the frequency divider 4 being applied respectively to the pairs of terminals 22 and 23, and an output signal to the loop filter being derived at the terminals 24.

We claim:

1. A frequency tracking arrangement comprising:
    a continuously variable phase shift circuit having an input for receiving a reference frequency signal, an output providing a phase-shifted reference frequency signal and a control input, said phase shift circuit realized by an an active first order all-pass filter;
    a phase comparator having a first input for receiving the reference frequency signal, a second input coupled to receive the phase-shifted reference frequency signal and an output for providing a control signal obtained from a phase comparison between signals on said first input and said second input; and
    a feedback circuit for applying said control signal to the control input of the continuously variable phase shift circuit thereby to control, in use a value of phase shift applied by the continuously variable phase shift circuit dependent upon said phase comparison;
    a controllable continuous-time filter; and
    an adjusting circuit having:
        a first input coupled to the frequency tracking arrangement and receptive, in use, to the control signal;
        a second input responsive, in use, to an adjusting signal; and
        an output coupled to said controllable continuous-time filter, the output providing, in use, a filter control signal to control operational characteristics of said controllable continuous-time filter and wherein the filter control signal generated by the adjusting circuit is dependent upon said control signal and said adjusting signal.

2. The frequency tracking arrangement in accordance with claim 1, further including:
    a plurality of controllable delay lines indicative of varying time delays introducible, in use, into the frequency tracking circuit; and
    a delay line control circuit for selectively generating, in use, delay line enablement signals, the delay line control circuit having:
        i) an input coupled to the frequency tracking arrangement and responsive, in use, to the control signal; and
        ii) a plurality of outputs each coupled to one of the plurality of controllable delay lines, the plurality of outputs communicating, in use, delay line enablement signals to respective delay lines to cause selection thereof.

3. The frequency tracking arrangement in accordance claim 1 wherein the phase comparator is an analog multiplier circuit.

4. The frequency tracking arrangement in accordance with claim 3 wherein the analogue multiplier circuit is a Gilbert cell.

5. A frequency tracking arrangement for use in retrieving data from an optical disk data carrier, the frequency tracking arrangement applying a control signal to at least one of a continuously variable analog filter circuit and a plurality of controllable delay lines arranged to introduce, in use and on a selective basis, time delays, the frequency tracking arrangement comprising
    a phase shift circuit having an input for receiving a reference frequency signal,
    a phase comparator having a first input for receiving the reference frequency signal and a second input for receiving a phase shifted reference frequency signal from the phase shift circuit and an output for providing a control signal in response to a phase comparison of the signals on the first input and the second input,
    a feedback circuit for applying the control signal from the phase comparator to a control input of the phase shift circuit to control a value of phase shift; and at least one of:
        an adjusting circuit for receiving, in use, the control signal and providing an adjusted control signal to the continuously variable analog filter circuit in response to an adjusting signal; and
        a control circuit responsive to the control signal and arranged to selectively adjust time delays introduced by said plurality of delay lines.

6. The frequency tracking arrangement in accordance with claim 5, wherein the phase shift circuit includes an active first order all-pass filter.

7. An optical disk system having a frequency tracking arrangement for use in retrieving data from a carrier, the frequency tracking arrangement applying a control signal to at least one of a continuously variable analog filter circuit and a plurality of controllable delay line arranged to introduce, in use and on a selective basis, time delays, the frequency tracking arrangement comprising:

a phase shift circuit having an input for receiving a reference frequency signal, a phase comparator having a first input for receiving the reference frequency signal and a second input for receiving a phase shifted reference frequency signal from the phase shift circuit and an output for providing a control signal in response to a phase comparison of the signals on the first input and the second input, a feedback circuit for applying the control signal from the phase comparator to a control input of the phase shift circuit to control a value of phase shift; and:

an adjusting circuit for receiving the control signal and providing an adjusted control signal to the continuously variable analog filter circuit in response to an adjusting signal; and a control circuit responsive to the control signal and arranged selectively to adjust time delays introduced by said plurality of delay lines.

8. The optical disk system in accordance with claim 7, wherein the phase shift circuit includes an active first order all-pass filter.

9. A method of providing frequency tracking in an optical storage system that recovers data from a carrier, the method comprising:

applying a reference frequency signal to a phase shift circuit and processing said reference frequency signal through an active first order all-pass filter of the phase shift circuit, thereby to provide a phase-shifted reference frequency signal;

applying the reference frequency signal as a first input to a phase comparator and applying the phase-shifted reference frequency signal as a second input to the phase comparator;

generating a control signal dependent upon a phase comparison between signals on said first input and said second input of the phase comparator;

controlling a value of phase shift applied by the phase shift circuit by applying the control signal to a control input of the phase shift circuit via a feedback loop; and generating an adjusting signal to adjust a filter circuit responsive to the control signal and an adjusting signal.

* * * * *